US012754244B2

(12) United States Patent
Kang et al.

(10) Patent No.: US 12,754,244 B2
(45) Date of Patent: Oct. 6, 2026

(54) STATE-OF-CHARGE ESTIMATOR FOR LITHIUM-ION BATTERY USING HYSTERESIS MODEL

(71) Applicant: GM GLOBAL TECHNOLOGY OPERATIONS LLC, Detroit, MI (US)

(72) Inventors: Jun-Mo Kang, Ann Arbor, MI (US); Hanho Yun, Oakland Township, MI (US)

(73) Assignee: GM Global Technology Operations LLC, Detroit, MI (US)

(*) Notice: Subject to any disclaimer, the term of this patent is extended or adjusted under 35 U.S.C. 154(b) by 461 days.

(21) Appl. No.: 18/480,129

(22) Filed: Oct. 3, 2023

(65) Prior Publication Data

US 2025/0110178 A1 Apr. 3, 2025

(51) Int. Cl.

| | |
|---|---|
| ***G01R 31/367*** | (2019.01) |
| ***G01R 31/364*** | (2019.01) |
| ***G01R 31/3842*** | (2019.01) |
| ***G01R 31/387*** | (2019.01) |
| ***H01M 10/42*** | (2006.01) |

(Continued)

(52) U.S. Cl.

CPC ......... *G01R 31/367* (2019.01); *G01R 31/364* (2019.01); *G01R 31/3842* (2019.01); *G01R 31/387* (2019.01); *H01M 10/425* (2013.01); *H01M 10/0525* (2013.01); *H01M 2010/4271* (2013.01); *H01M 10/48* (2013.01)

(58) Field of Classification Search

USPC ............................................................ 702/63

See application file for complete search history.

(56) References Cited

U.S. PATENT DOCUMENTS

| | | | | |
|---|---|---|---|---|
| 11,662,387 B1 * | 5/2023 | Wampler, II ......... | G01R 31/382 324/431 |
| 2003/0076109 A1 * | 4/2003 | Verbrugge ........... | G01R 31/392 324/427 |

(Continued)

FOREIGN PATENT DOCUMENTS

| | | |
|---|---|---|
| DE | 102010003422 A1 | 10/2011 |
| DE | 112017005514 T5 | 12/2019 |
| DE | 102022126496 A1 | 8/2023 |

OTHER PUBLICATIONS

Gregory L. Plett, "Extended Kalman filtering for battery management systems of LiPB-based HEV battery packs Part 2. Modeling and identification", Journal of Power Sources 134 (2004) 262-276.

*Primary Examiner* — Paul D Lee
(74) *Attorney, Agent, or Firm* — Quinn IP Law

(57) ABSTRACT

An electric vehicle (EV), and systems and methods are introduced in aspects of the disclosure that use a battery management system (BMS) for one or more Lithium ion (Li+) battery cells. The BMS includes an apparatus coupled with outer terminals of the one or more Li+ battery cells and configured to estimate an open circuit voltage ($V_{OC}$) across the Li+ battery cells. The apparatus further includes a memory, at least one processor coupled with the memory. The at least one processor is configured, when executing code stored in the memory, to produce a state of charge (SOC) observer, the SOC observer including a hysteresis model to account for hysteresis in the one or more Li+ battery cells.

20 Claims, 5 Drawing Sheets

(51) Int. Cl.
*H01M 10/0525* (2010.01)
*H01M 10/48* (2006.01)

(56) References Cited

U.S. PATENT DOCUMENTS

| | | | | | |
|---|---|---|---|---|---|
| 2014/0333317 | A1 * | 11/2014 | Frost | G01R 31/3842 | 324/430 |
| 2016/0064972 | A1 * | 3/2016 | Stefanopoulou | G01R 31/387 | 324/426 |
| 2020/0185792 | A1 * | 6/2020 | Wampler, II | B60L 3/12 | |
| 2023/0266396 | A1 * | 8/2023 | Wampler, II | B60L 3/12 | 324/426 |

* cited by examiner

STATE-OF-CHARGE ESTIMATOR FOR LITHIUM-ION BATTERY USING HYSTERESIS MODEL

INTRODUCTION

State-of-charge (SOC) is a parameter used for estimating remaining charge in Lithium ion (Li+) batteries, presently used in a variety of applications. While a plethora of applications for Li+ batteries exist, one such application includes using Li+ batteries to power electric vehicles (EVs). SOC in this case is needed to determine how long the driver has before the EV stops working, which, like a gas tank gauge in a combustion-based vehicle, makes SOC a significant parameter. To this end, numerous techniques to estimate SOC in LI+ batteries have been implemented or proposed in the literature. For the EV industry, these techniques are commonly deployed in a battery management system (BMS) coupled with terminals of the Li+ cells or packs.

Ordinarily, SOC may be accurately modelled as a curve of voltage (vertical axis) versus SOC (horizontal axis). In this model, the SOC may adequately be construed to resemble a single curve, such that whether the battery is charging or discharging, a measurement will more or less yield a single voltage value within an acceptable margin of error for each SOC. For many Li+ battery configurations, approximating the SOC gives sufficiently accurate measurements.

Different configurations of Li+ batteries exist. For reasons not precisely understood, certain such configurations are more prone to inaccurate SOC measurements. That is, certain otherwise effective Li+ battery configurations may give rise to an undesirably pronounced hysteresis effect. For example, each SOC in a charging-discharging cycle may be plotted as an envelope of open circuit voltage ($V_{OC}$) (vertical axis) versus SOC (horizontal axis), where each SOC in a charge-discharge cycle corresponds to multiple $V_{OC}$ values that differ beyond accepted margins of errors. Existing models for measuring SOC in these cases more than likely fail by returning inaccurate SOC results.

SUMMARY

Aspects of this disclosure include using an enhanced SOC observer model executing on a processor, or plurality thereof, in a battery management system. In some implementations, accurate SOC estimation may be accomplished by augmenting a standard SOC observer model with a hysteresis model, with the combined models configured as executable code for running on the processor(s), whether in a BMS coupled to the battery terminals at the cell or pack level, or otherwise.

In one aspect of the present disclosure, a battery management system (BMS) for one or more Lithium ion (Li+) battery cells includes an apparatus coupled with outer terminals of the one or more Li+ battery cells and configured to estimate an open circuit voltage ($V_{OC}$) across the Li+ battery cells. The apparatus further includes a memory and at least one processor coupled with the memory and configured, when executing code stored in the memory, to produce a state of charge (SOC) observer, the SOC observer including a hysteresis model to account for hysteresis in the one or more Li+ battery cells.

In another aspect of the present disclosure, an electric vehicle (EV) includes a body. The body is coupled to a dashboard and houses an internal vehicle cabin. The internal vehicle cabin has a plurality of controls and dials including an indicator identifying an amount of charge or a time period remaining for the EV to continue to run. The identified charge or time is based on a state of charge (SOC) of the lithium ion (Li+) battery cells. The EV also includes a suspension system coupled with the body and coupled to at least four wheels, and a battery management system (BMS) for one or more of the Li+ battery cells. The BMS includes an apparatus coupled with outer terminals of the one or more Li+ battery cells and configured to estimate a state of charge (SOC) of the Li+ battery cells. The apparatus further includes a memory, and at least one processor coupled with the memory and configured, when executing code stored in the memory, to produce a state of charge (SOC) observer, the SOC observer including a hysteresis model to account for hysteresis in the one or more Li+ battery cells.

In still another aspect of the disclosure, a method for determining the state of charge (SOC) of an electric vehicle (EV) powered by lithium ion (Li+) batteries exhibiting hysteresis, includes coupling a battery management system (BMS) with outer terminals of the Li+ ion batteries, executing code on at least one processor to determine an open circuit voltage ($V_{OC}$), coupling the BMS with outer terminals of the Li+ battery cells, and executing code by at least one processor within the BMS to produce a state of charge (SOC) observer, the SOC observer including a hysteresis model to account for hysteresis in the Li+ battery cells.

In various configurations of each of the above aspects, the SOC observer may include in the hysteresis model a charge to discharge state and a discharge to charge state that when combined, results in continuous transitions of the open circuit voltage ($V_{OC}$) in both charge and discharge directions. The SOC observer is configured to use the charge to discharge state and the discharge to charge state to predict the $V_{OC}$. The SOC observer may further include an SOC model, the SOC model being further coupled with a resistance model for estimating voltage drop due to current, an overpotential model for accounting for changes to a terminal voltage, and the hysteresis model.

In various embodiments, the at least one processor is configured, when executing the code to produce the hysteresis model, to determine static nonlinearity based on a direction of current flow. The at least one processor is configured, when executing the code to produce the hysteresis model, to determine an initial state of the hysteresis model from a charge to a discharge or a discharge to a charge when a change in a direction of a current is detected. The SOC observer may include a Kalman filter, or another type of circuit.

The above summary is not intended to represent every embodiment or every aspect of the present disclosure. Rather, the foregoing summary merely provides examples of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes the various combinations and sub-combinations of the elements and features presented above and below.

BRIEF DESCRIPTION OF THE DRAWINGS

The accompanying drawings, which are incorporated into and constitute a part of this specification, illustrate implementations of the disclosure and together with the description, explain the principles of the disclosure.

Figure 1:
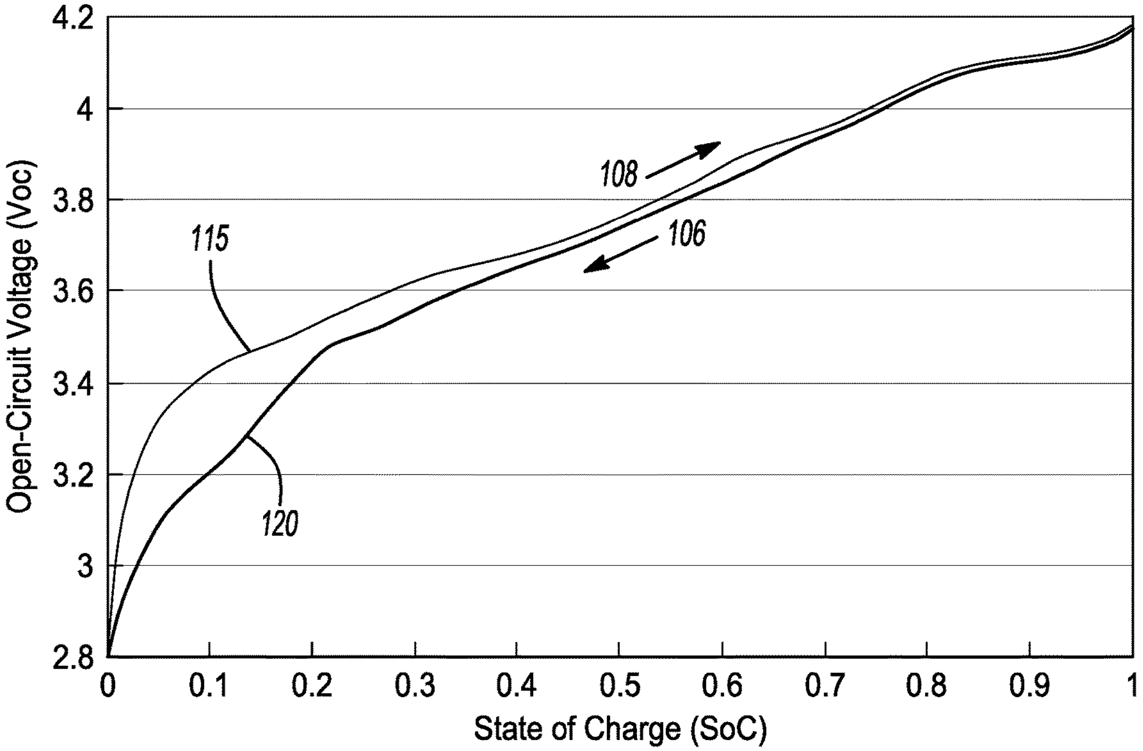
FIG. 1 is an exemplary graph of a single charge-discharge cycle of the open-circuit voltage $V_{OC}$ versus SOC of an Li+ battery cell, which includes more pronounced hysteresis at lower $V_{OC}$ charge and discharge levels.

The appended drawings are not necessarily drawn to scale and may present a simplified representation of various features of the present disclosure, including, for example, specific dimensions, orientations, locations, and shapes. In some cases, well-recognized features in certain drawings may be omitted to avoid unduly obscuring the concepts of the disclosure. Details associated with such features will be determined in part by the particular intended application and use case environment.

DETAILED DESCRIPTION

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, and the words "including," "containing," "having," and the like shall mean "including without limitation." Moreover, words of approximation such as "about," "almost," "substantially," "generally," "approximately," etc., may be used herein in the sense of "at, near, or nearly at," or "within 0-5% of", or "within acceptable manufacturing tolerances", or logical combinations thereof. As used herein, a component that is "configured to" perform a specified function is capable of performing the specified function without alteration, rather than merely having potential to perform the specified function after further modification. In other words, the described hardware, when expressly configured to perform the specified function, is specifically selected, created, implemented, utilized, programmed, and/or designed for the purpose of performing the specified function. It should also be noted that, for purpose of this disclosure, the terminology $V_{OC}$ and OCV (open circuit voltage) are often used interchangeably.

The BMS is an electronic management system used to perform important measurements, gather relevant metrics, and perform other safety and performance-related functions on a battery pack (e.g., in an EV) to which it is coupled. While the BMS may perform a variety of practical functions, the term "BMS" is liberally used herein to refer to hardware for performing the measurements and functions identified herein and for manipulating the Li+ batteries as described with respect to the implementations herein.

FIG. 1 is an exemplary graph of a single charge-discharge cycle of the open-circuit voltage $V_{OC}$ versus SOC of an Li+ battery cell. This particular Li+ cell demonstrates, which becomes more pronounced at lower $V_{OC}$ charge and discharge levels. Properly addressing the potential complexities of the SOC parameter entails first understanding how the SOC is modeled (see FIG. 2) within an estimator or observer device. An observer device may be implemented on a circuit in the battery management system (BMS), including for example a processor (which itself may include one or more processors) within which code may be executed, a DSP, application-specific integrated circuit (ASIC), system-on-a-chip (SoC), field programmable gate array (FPGA), digital combinational logic elements, or a physically-realizable device that may execute code or other hardware-based functions to estimate the SOC of a given battery cell or pack. Referring initially to FIG. 1, the vertical axis of the graph represents $V_{OC}$, the open-circuit voltage of the battery, or the voltage measured across the battery terminals when the current through the battery is 0 amperes (Amps). The horizontal axis represents SOC, which is defined as the ratio of the available battery capacity to its rated maximum capacity. Curve 115 represents the charging 108 of the battery. As the battery is charged, both its SOC and $V_{OC}$ values increase. Curve 120 represents the discharging 106 of the battery. Similarly, as the battery is discharged, its SOC and $V_{OC}$ values decrease. $V_{OC}$ is, as noted, measured when the current through the battery ($i_{batt}$) is 0. $V_{OC}$ may be measured across the terminals of a battery cell, across a pack, or using another configuration. If a battery pack voltage is measured, the estimator (e.g., processor in the battery management system) may divide the measured voltage by the number of cells in series to obtain the cell level voltages. For purposes of this disclosure where appropriate in the context, the term "battery" may be used broadly to encompass a Lit cell or pack, with serial and/or parallel connections.

To reproduce the graph of data values in FIG. 1, the BMS may charge 108 the battery for a specified time, then stop charging 108 to enable the estimator to measure $V_{OC}$ and the corresponding SOC. Charging 108 may thereafter resume, and periodically suspended to obtain $V_{OC}$ until the battery is charged. The BMS may then discharge 106 the battery using the same general technique in reverse (e.g., periodically stopping the discharge 106 to measure $V_{OC}$ at the SOC level). It should be noted that if the BMS measures some internal current in the cell after stopping the current flow to measure $V_{OC}$, the BMS should also capture the direction of this current in the SOC estimator (FIG. 2).

It will be appreciated that in a basic Li+ cell, the hysteresis may be so small that it is within an acceptable margin of error and can be disregarded. An example of such a cell is Li+ battery using graphite as the anode. However, in other configurations such as when $SiO_2$ is used as the anode material, or some other chemical or physical change is incorporated into the battery, the errors introduced by the more significant hysteresis cannot be ignored.

Figure 2:
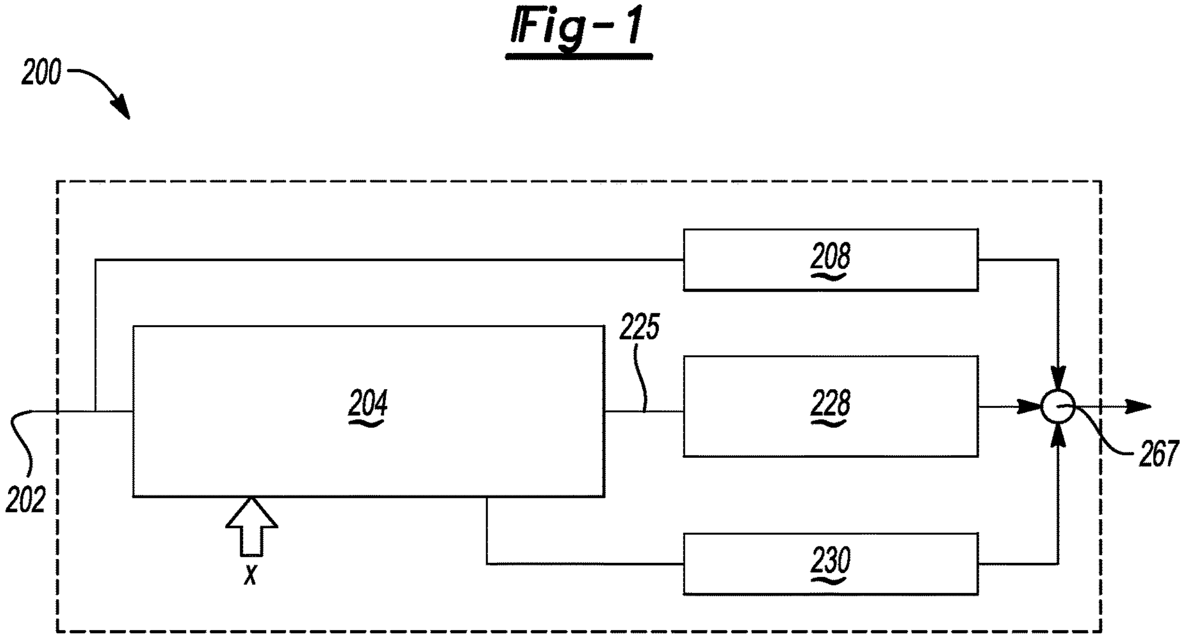
FIG. 2 is a conceptual diagram of a model for modeling for estimating various SOCs in a battery charge/discharge cycle.

FIG. 2 is a conceptual diagram of an equivalent circuit model 200 for estimating various SOCs in a battery charge/discharge cycle. The model may be used to construct the SOC estimator module by approximating nonlinear behavior within the battery and other recognized phenomena, such as by taking into account additional numerical phenomena to obtain $V_{OC}$. A number of different models may exist. The model of FIG. 2 is one example of different functions representing the operational characteristics of a Li+ cell for purposes of estimating SOC while simultaneously taking into account other internal chemical or electrical functions that may bear on SOC. In short, an understanding of SOC begins with modeling battery characteristics including, for example, $V_{OC}$, the effect of internal current flow within the model, nonlinear characteristics, and the like, and adding the different characteristics to produce a result that may be used to accurately estimate SOC.

Referring to resistance module 208, this module may be used to take into account the current that may occur in registers within the cell. A register in a cell may produce a resistance that may induce a voltage drop. The resistance module 208 is that portion of the model that accounts for this voltage drop. Various means in the art have traditionally been used to implement the resistance portion of the model when performing SOC estimation. Here, the resistance model 208 may be modeled using a resistance in battery registers having a target value into which the current flows to cause the voltage drop, as noted. The $V_{OC}$ voltage drop may be added to the voltage drop associated with the model resistance value. In this embodiment, the model 200 is losing voltage due to the resistance in the internal registers, which is taken into by model 200 account in the overall addition.

The battery model 200 may include an input current 202 entering into an SOC model 204, the latter of which is an open-loop model intended to account for relevant internal cell parameters and behavior that bears on SOC in the Li+ cell to be measured. In other example models, the current 202 may additionally represent the current that is leaving the SOC model when discharging the battery associated with the model. It is noteworthy that portions of the SOC model 204 may be affected due to practical factors like cell temperature, aging of the battery, and other factors referred to as X. The SOC model 204 may be modeled, or subsequently adjusted, to take these factors into account. For example, intrinsic values within the SOC model 204 may be adjusted based on factors X. In one configuration, the SOC model may model the capacitances, resistances, passive circuits, temperatures, process corners, and other parameters of the battery model 200 to take into account potential SOC estimation error. Upon estimating an initial SOC, the SOC model may produce the estimated SOC as an output 225. In this case, the output 225 may be provided to the nonlinear function model 228. The nonlinear function model 228 may be used to account for the nonlinear relationships between SOC and $V_{OC}$.

The battery model 200 may also take into account the cell's overpotential, as shown in overpotential model 230. When a current is applied to a Li+ cell, the resulting terminal voltage may be changed by the overpotential. Various understood phenomena are generally taken into account that may be used to quantify the overpotential for producing an accurate voltage 267 based on the internal register's current (resistance model 208), the various nonlinear functions that exist in the context of a static $V_{OC}$ curve (nonlinear function model 228), and the overpotential model 230. Because the hysteresis model may be highly dependent on the chemistry of the Li+ cell, including the anode, the mathematical equations used to represent models 208, 228 and 230 may be different. One significant advantage of battery model 200, however, is that once the model is developed for a specific Li+ battery cell, the SOC model 205 may be used on subsequent models of this cell without needing structural modification.

In addition, the nonlinear function model 228 and the overpotential models, which may affect the overall voltage, may also be taken into account. The various parameters, including charge and discharge current, may change depending on the direction of the internal battery current. The model 200 is introduced to show how the terminal voltage behaves, taking into various considerations such as, as noted above, the direction of internal current flow. This direction leads to different output values and therefore is important in modeling the behavior of a Li+ battery cell.

Additional models (whether linear or nonlinear, static or dynamic) may be developed to describe the behavior of a Li+ battery with new chemistries, structures, or functional characteristics. One such example is a hysteresis model, which is highly dependent on the chemical configuration of the Li+ cell. Examples include a silicon anode, a lithium metal anode, and others.

Figure 3:
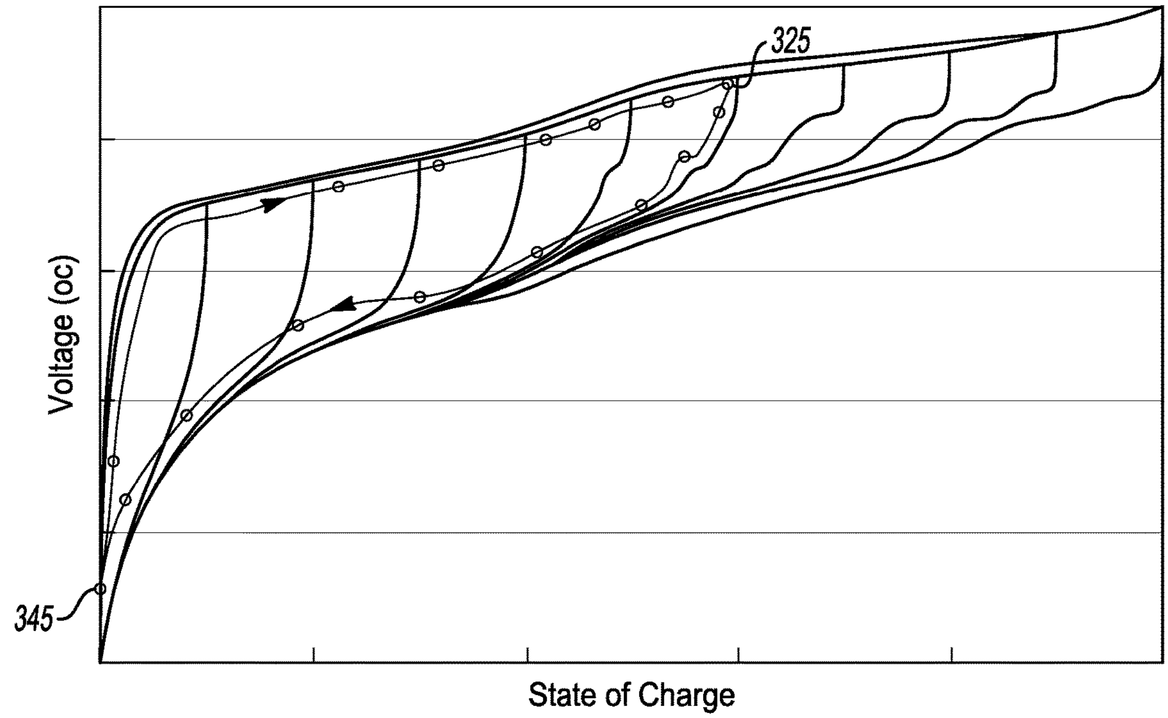
FIG. 3 is an example graph of hysteresis occurring in an existing battery and a selected charge-discharge cycle among the plurality of charge-discharge cycles identified in the graph.

FIG. 3 is an example graph of hysteresis occurring in an existing battery and a selected charge-discharge cycle among the plurality of charge-discharge cycles identified in the graph. Portions of FIG. 3 identifying the hysteresis curve of a silicon-base anode were prepared as an article that appeared in the Institute for Electrical Engineering Journal (IEEE) in 2020 authored by Carles Pregonas Graells, M. Scott Trimboli, and Gregary L. Plett. Portions of FIG. 3 in this application were reproduced from FIG. 1 in *Differential hysteresis models for a silicon-anode Li-ion battery cell,* "2020 IEEE Transportation Electrification Conference & Expo (ITEC), Chicago, IL, USA, 2020, pp. 175-180, doi: 10.1109/ITEC48692.2020.9161591.

Before referring to FIG. 3 in more detail, it should be noted that hysteresis in many cases is so small that it may be ignored. For example, in a graphite anode of a Li+ cell with other parameters being equal, the hysteresis phenomenon is magnitudes of level smaller and thus estimation of SOC does not need to take this phenomenon into account.

Referring back to FIG. 3, the authors of the original drawing have plotted a silicon-anode Li+ battery cell, in which hysteresis on a graph of Voltage versus SOC for that Li+ battery cell is clearly relevant. Notably, in FIG. 3, there are several transient traces where the values of SOC and $V_{OC}$ converge into a closed loop. To identify one such loop, the inventors over-trace the graph with an arrowed curve, refer to a lower portion of an SOC region. Thus, for example, point 325 corresponds to the uppermost point on that particular $V_{OC}$/SOC curve, while point 345 corresponds to the lowermost point on the same $V_{OC}$/SOC curve. The vertical axis is $V_{OC}$, and the horizontal axis is SOC.

Figure 4A:
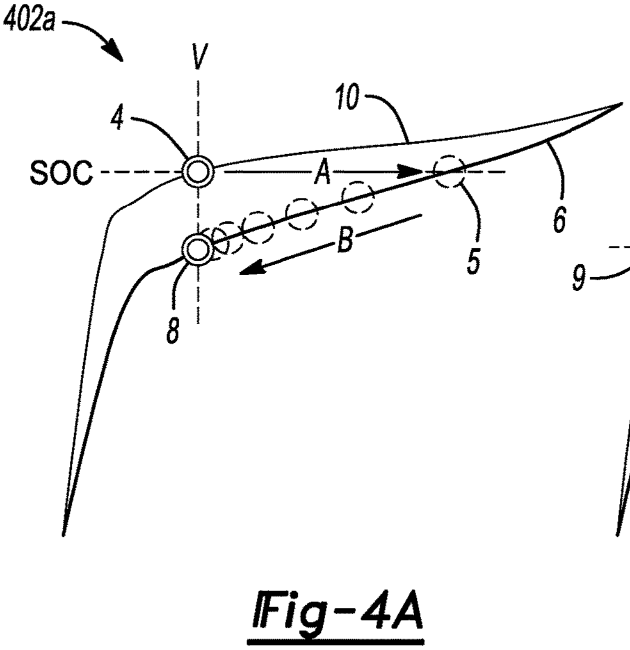
FIGS. 4A and 4B describe techniques for development of a hysteresis model, in accordance with an aspect of the disclosure.
Figure 4B:
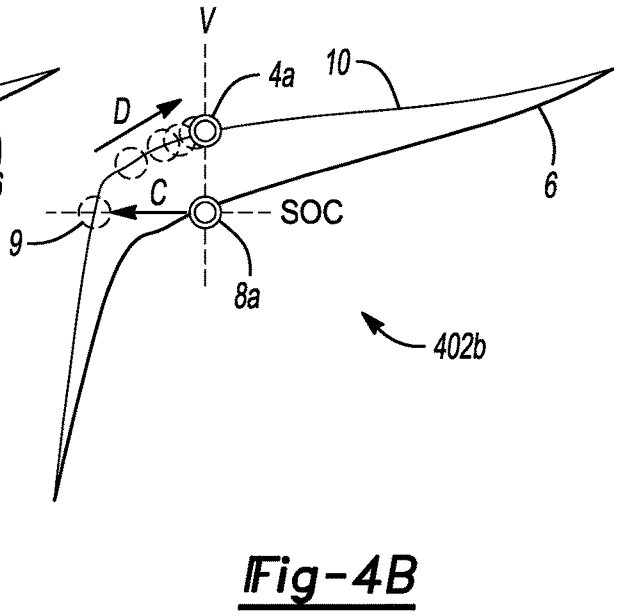

From the above data representing the hysteresis of the Li+ cell, the inventors have developed a procedure for estimating SOC to account for this non-negligible hysteresis. Part of this procedure involves being capable of moving between one OCV curve and another. FIG. 4A FIG. 4B describe techniques for development of a hysteresis model, in accordance with an aspect of the disclosure. FIGS. 4A-4B represent hysteresis curves. In the development of the hysteresis model, one objective is a model that results in continuous OCV transitions in both directions. The tuning parameters, as reflected in the drawings, are to (1) charge and discharge $V_{OC}$, meaning that $V_{OC}$ should be closed at each end, and (2) note that the time constant of $V_{OC}$ transitions. The direction of current flow may govern whether a charge to discharge model is used, or a discharge to-charge model is used. This information in turn enables the SOC observer (FIG. 5) to determine static nonlinearities in Li+ battery cells and decaying behavior of the state of the hysteresis model.

The charge-to-discharge model 402*a* of FIG. 4A is focused on the low SOC region of FIG. 1. The technique of FIG. 4A is applicable to a charge to discharge state of the battery. FIG. 4B, by contrast, is an attempt to reproduce the non-curvy portion of FIG. 3 and describes a discharge to a charge state. The main idea of the hysteresis models 402*a* and 402*b* in FIGS. 4A and 4B is to transit between one OCV curve and the other such that $V_{OC}$ is continuous through the transaction. Referring initially to FIG. 4A, the SOC observer begins at the circle 4 after charging. The horizontal arrow A is then followed to instantaneously move to the discharge OCV 6 when discharging begins, which is the portion of the hysteresis curve corresponding to discharging. More specifically, in this example, the model follows arrow A to instantaneously arrive at the dashed circle 5. The instantaneous nature of the horizontal move from circle 4 to circle 5 is intended to demonstrate that, since the horizontal axis is voltage (V), when a discharge occurs, the instantaneous change enables an immediate, continuous transition in the OCV from one value to another.

Referring still to FIG. 4A, after reaching circle 5 of line 6 as noted above, the algorithm begins its discharge OCV. This time the arrow B is followed which gradually moves along the line 6 in the direction of discharge curve immediately above arrow B. The movement causes the cursor to gradually follow the discharge curve and its various circles via line 6. Ultimately, the cursor ends up at circle 8 if discharging current is sufficiently small, which is aligned with the circle 4 where the charge to discharge state began. Notably, circle 8 shares the same SOC as circle 4, but at a different voltage. Thus, the “charge to discharge” sweep is completed when the OCV voltage returns to the same SOC as before, but with the OCV now at a reduced value. The time constant for the “charge to discharge” sweep may be experimentally determined.

The direction of the current during the charging and discharging may be determined by the BMS or processor coupled with the battery. The direction enables the processor to determine whether the battery is being charged or discharged. This information, in turn, may be used to determine which technique (i.e., that of FIG. 4A versus FIG. 4B) is applicable given the direction of the current. From this data, the static nonlinearities of the system may be determined, and the coefficients for the model may be accurately applied.

The model 402*b* in FIG. 4B is similar in principle to FIG. 4A but analyzes the curve from a discharge to charge state. The SOC observer begins at circle 8*a*. The horizontal arrow C is then followed to instantaneously sweep to circle 9 on the opposite side of the hysteresis curve, which is the portion of the hysteresis curve corresponding to charging. The instantaneous horizontal move from circle 8*a* to circle 9 allows an immediate change of OCV from one value to another. After reaching circle 9 on line 10, the algorithm begins its charge OCV. This time the arrow D is followed which gradually moves along the line 10 in the direction of charge curve above arrow D. The sweep causes the cursor to gradually follow the discharge curve and its various circles via line 10, as the SOC gradually begins to increase. Ultimately, the cursor ends up at circle 4*a* if charging current is sufficiently small, which is aligned with the circle 8*a* where the “discharge to charge” procedure began. Analogous to FIG. 4A, circle 4*a* shares the same SOC as circle 8*a*, but at a different voltage. Thus, the “discharge to charge” sweep is completed when the OCV voltage returns to the same SOC as before, but with the OCV now at an increased value. The time constant for the “discharge to charge” sweep may be experimentally determined.

Following the above model enables the SOC observer to capture the traces, including the bumpy curves where the OCV traces begin to converge to a single SOC, on the differential hysteresis model of FIG. 3 for a silicon-anode Li+ ion battery. The sweeps of FIGS. 4A and 4B should incorporate the following tuning parameters. First, the charge and discharge OCVs need to be closed at each end. An example of this can be seen with respect to the points 325 and 345 of FIG. 3, where each point shares a unique SOC. Compliance with this parameter is also apparent in FIGS. 4A and 4B, where curves 10 and 6 converge to a single point at both ends in both figures. The second tuning parameter is that the time constant of OCV transitions should be consistent in both charge to discharge and discharge to charge scenarios in order to ensure that the OCV transitions in the graph are accurately modeled. Further, using these tuning parameters may enable the model to accurately determine the decaying behavior of the state of the hysteresis model.

Using the correct tuning parameters in the models of FIGS. 4A and 4B may enable the SOC observer 554 to determine the initial state of the hysteresis model when a change in the direction of the current occurs, such as when the Li+ battery changes from being charged to being discharged.

Figure 5:
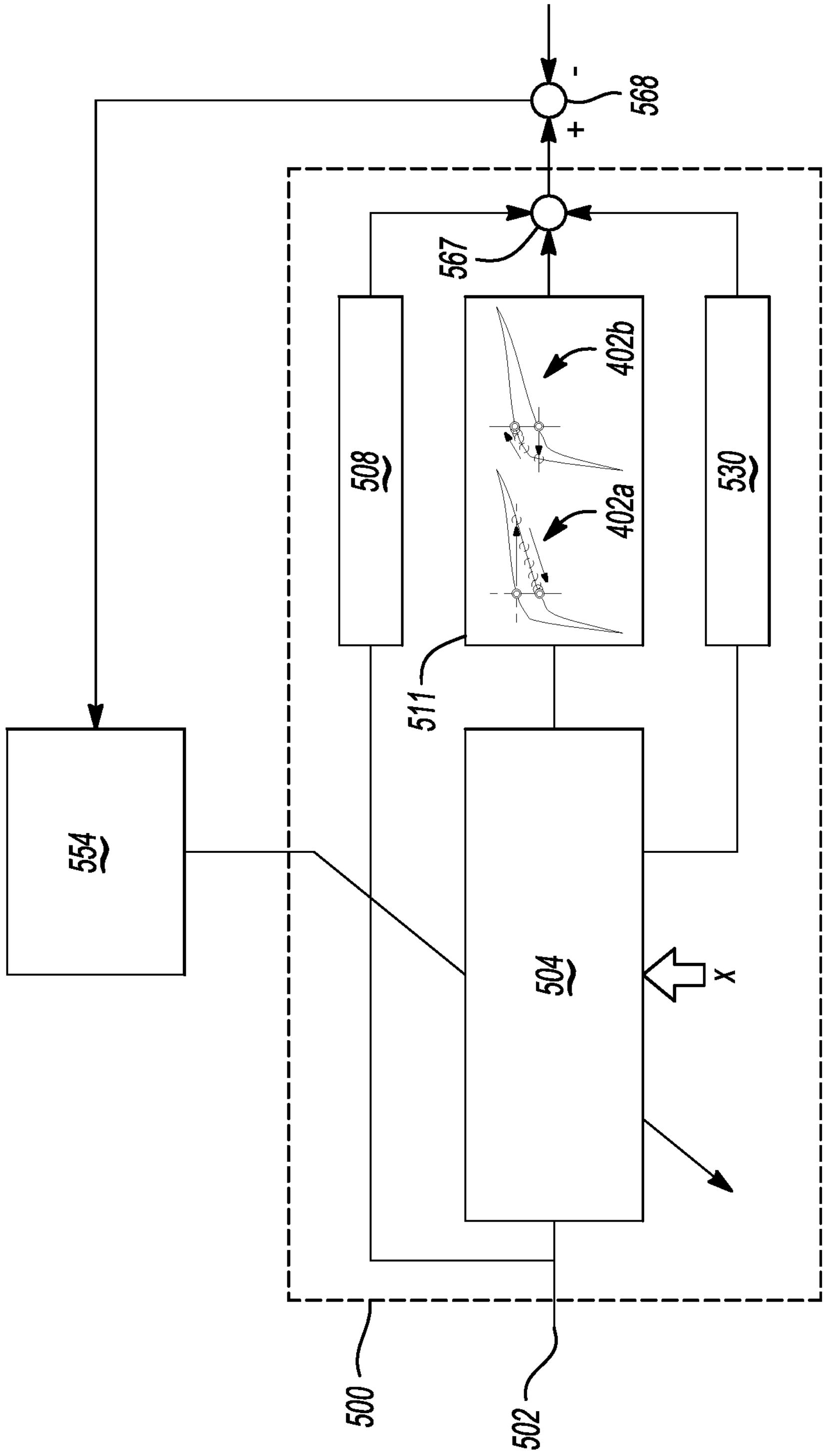
FIG. 5 is a schematic of an SOC observer module that takes hysteresis into account to provide an accurate SOC, in accordance with an aspect of the disclosure.

FIG. 5 is a schematic of an SOC observer module that takes hysteresis into account to provide an accurate SOC, in accordance with an aspect of the disclosure. Similar to FIG. 2, FIG. 5 includes a model 500 that illustrates how the SOC is modeled using different mathematical techniques. For example, FIG. 5 includes an SOC model 504, which may receive a current 502 similar to the receipt of current 202 of SOC model 204 of FIG. 2. Like in FIG. 2, the SOC model 504 may be affected by factors including cell temperature and aging (“X”) of the Li+ battery cell. The SOC model 504 may be modified as these factors become more pronounced. The model 500 may also incorporate a resistance module 508 to account for internal current in registers within the Li+ batteries as well as an overpotential module 530 to account for intercalating materials used in Li+ batteries. However, unlike the non-linear function 228 of FIG. 2 which was directed to modeling a static OCV curve, the model 500 in FIG. 5 attempts to capture the dynamic curve with hysteresis. This may include, but is not limited to, the differential hysteresis model due to the silicon anode described in FIG. 3 and modeled in FIGS. 4A and 4B. Additional and alternative changes in chemistry and structure to the Li+ battery may also induce hysteresis that needs a similar closed-loop solution to accurately estimate the SOC. Thus, referring to model 500, hysteresis module 511 may incorporate hysteresis models 402*a* and 402*b* (see FIG. 4) to augment the model 500 to account for the dynamic closed-loop hysteresis behavior. Different mathematical techniques may be used to incorporate these models 402*a* and 402*b* into hysteresis module 511. The result is that the hysteresis model 500 and SOC model 504 may now take into account the internal current (module 508), the hysteresis phenomenon (module 511 with models 402*a* and 402*b*), and the overpotential module 530. The resulting voltages are added up at node 567 as a modified voltage model.

The BMS or another circuit near the battery may be coupled to the battery terminals and used to measure the actual battery voltage in real time. The BMS may also include SOC observer 554. As noted, SOC observer 554 may in one implementation include code (software, firmware, middleware, etc.) stored in memory and executing in at least one processor local to the memory. In other configurations, the functions of SOC observer 554 may be performed using a digital signal processor (DSP), ASIC, SoC, or other circuit type. As shown in FIG. 5, the terminal voltage(s) 568 of the Li+ ion battery may be coupled to SOC observer 554 via a wired connection, for example. In some embodiments, the SOC observer 554 may be implemented as a Kalman filter, although other embodiments are possible and may be substituted for the Kalman filter without departing from the spirit or scope of the present disclosure. The model voltage 567 may be compared with the terminal voltage 568 or more specifically the terminal voltage from the Li+ batteries. This physical connection between the processor and the terminal voltage may be accomplished using connecting wires in the BMS, among other possibilities.

Using SOC observer 554 and the associated state of the model 500, the SOC may be advantageously adjusted in real time so that the voltage of the model 500 matches the measured terminal voltage. This process ensures accuracy of the SOC value. The SOC value may be communicated to a processor controlling a dashboard measurement, for example. SOC may be converted, if needed, to a value more accessible to a driver to enable the driver to determine the remaining power in a vehicle, or more specifically, how much longer the vehicle can be driven until a recharge is needed.

In sum, the model for assessing the SOC adds functions that enable the OCV curve to be swept to produce an SOC value that comports closely with experimental results. The hysteresis model introduced in FIG. 3 and incorporated into module 511 of model 500 in FIG. 5 enables the actual SOC value for a given voltage to be ascertained with significantly more accuracy.

Figure 6:
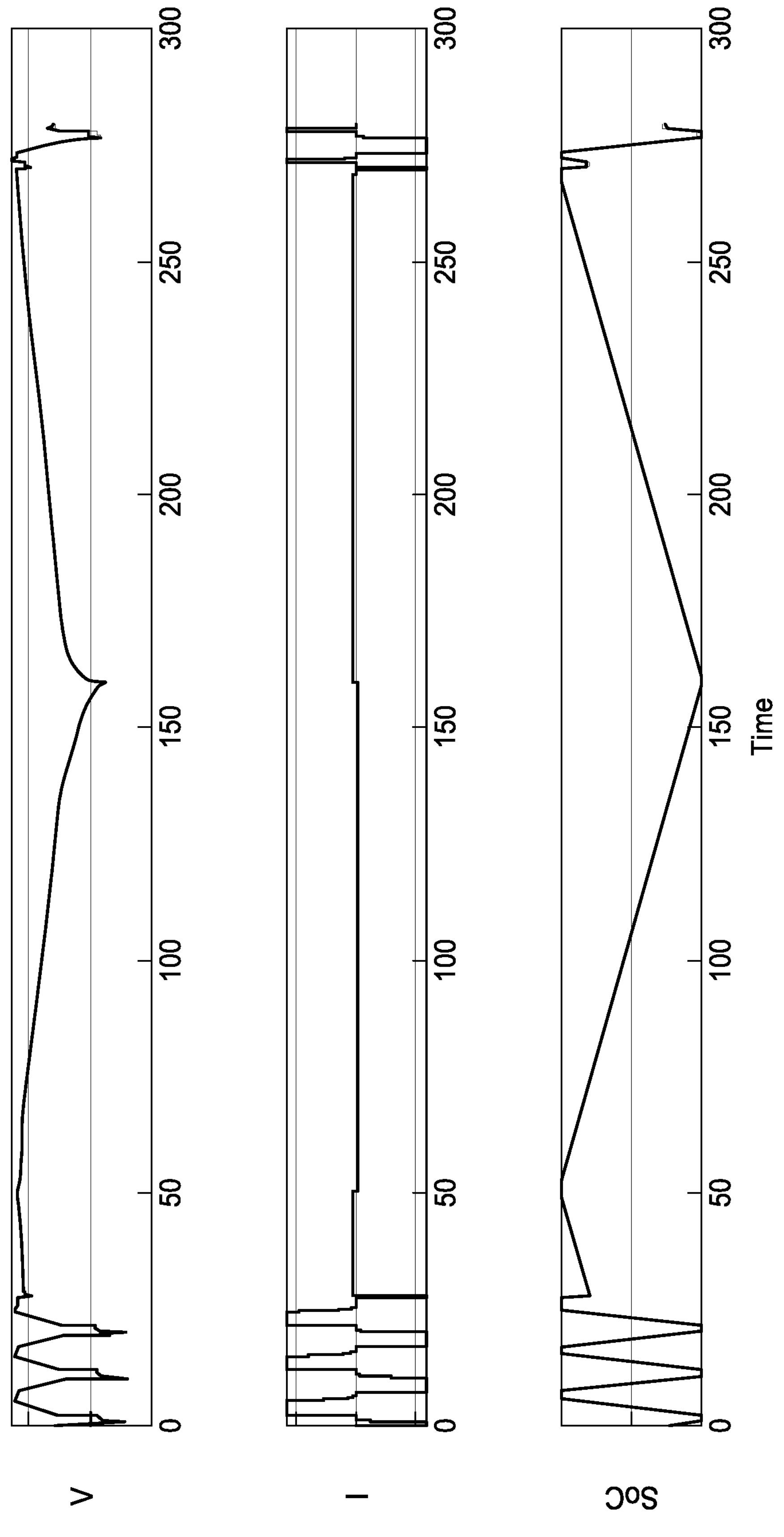
FIG. 6 is a set of schematics including an estimated SOC using a hysteresis model, in accordance with an aspect of the disclosure.

FIG. 6 is a set of schematics including an estimated SOC using a hysteresis model, in accordance with an aspect of the disclosure. The physical Li+ battery in this exemplary configuration uses a silicon anode, although other physical and chemical configurations that produce hysteresis may be contemplated. The horizontal axis on each graph represents time in seconds.

Referring to the uppermost diagram, the open-loop model of the battery voltage (V) with hysteresis is shown. The second diagram shows the experimentally measured current (I) through the battery terminals. In the first 20 time units of the graph, the current (I) through the charging and discharging of the battery exhibits similar behavior as the voltage (V) of the battery model with hysteresis. At about t=25 time units as the Li+ battery is slowly discharged, the experimentally measured battery current (I) is essentially constant. At about t=160 time units as the battery is gradually charged, causing V to slowly increase, the experimentally measured current shifts slightly but remains constant until the open-loop effects cause the voltage V to change at about t=175 time units along with the current I.

The bottom diagram represents the estimated SOC from the SOC observer. While not clear from the SOC graph, the graph includes the estimated SOC with an experimentally obtained value. Different graphs for each SOC measurement were not needed in this example because the estimated SOC more or less overlap with the value obtained through experiment, showing that the use of the hysteresis model with this Si-anode Li+ battery cell produced accurate results. It should be noted that certain tuning parameters may be incorporated into the battery model with hysteresis, including, among others, the rate used in catching up with the respective circles when undergoing charging and discharging in FIG. 3.

Figure 7:
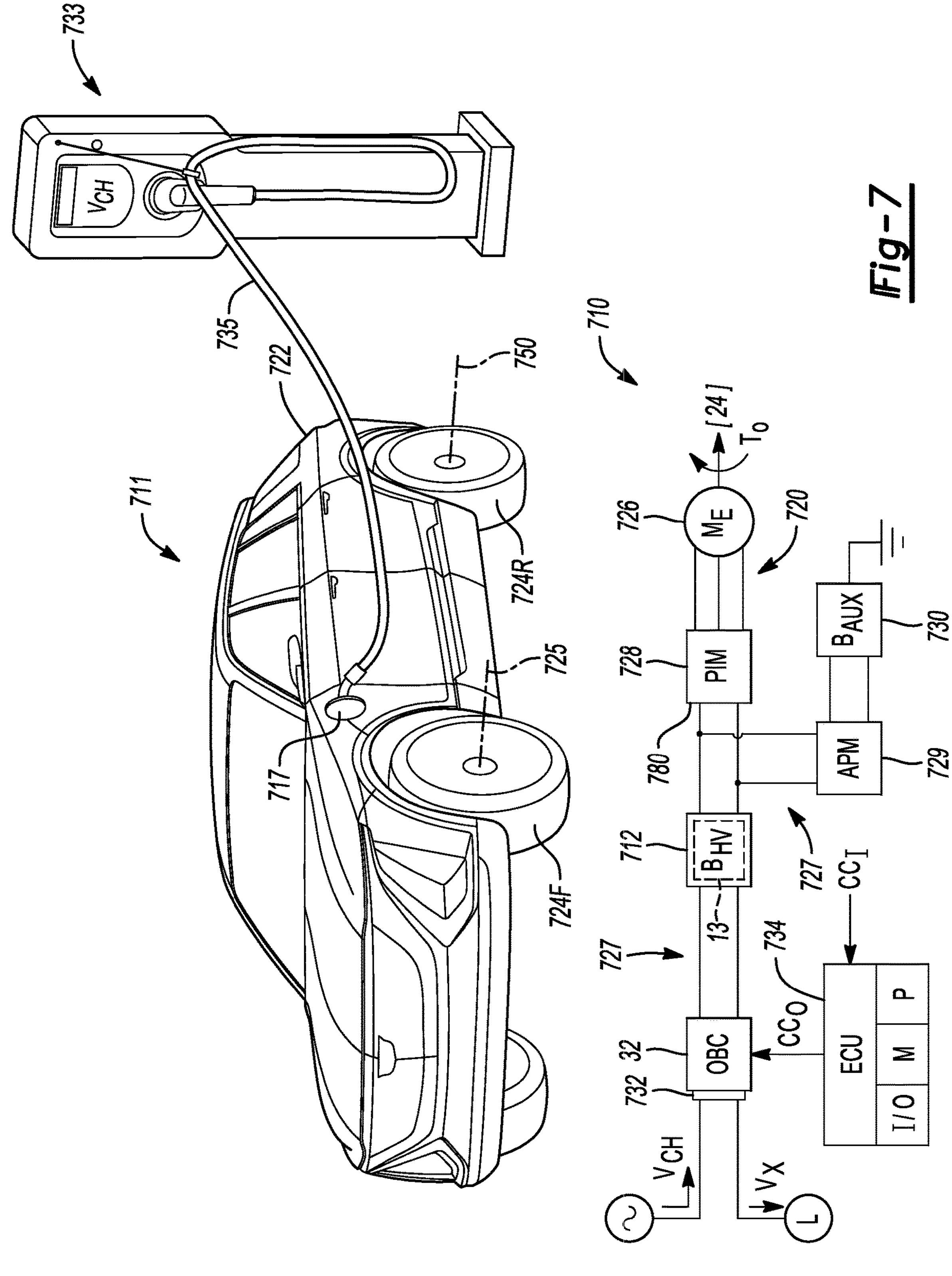
FIG. 7 is a plan view illustration of a vehicle and a battery system coupled to an Electronic Control Unit (ECU) for controlling aspects of the battery.

FIG. 7 is a plan view illustration of a vehicle and a battery system coupled to an Electronic Control Unit (ECU) for controlling aspects of the battery. While the above hysteresis models may apply to a number of different physical configurations, FIG. 7 shows one such example. FIG. 7 depicts an electrified powertrain system 710 having a high-voltage battery pack (BHV) 712 for which SOC estimations may be made. In a non-limiting example, the battery pack 712 may be embodied as a high-capacity battery having a voltage capability of about 400-800 volts or more, with the actual voltage capability of the battery pack 712 provided based on a desired operating/SOC range, gross weight, and power rating of a load connected to the battery pack 712. In a possible construction, the battery pack 712 may be a propulsion battery pack generally composed of an array of lithium-ion or lithium-ion polymer rechargeable electrochemical battery cells, which may be a cylindrical battery cell. The present teachings may also be applied to prismatic battery cells, and possibly to pouch-style battery cells in possible configurations, and thus the cylindrical battery cell is exemplary without being limiting.

Although internal details of the battery cells in battery pack 712 are omitted for illustrative simplicity, those skilled in the art will appreciate that the battery cells contain within the cell cavity an electrolyte material, working electrodes in the form of a cathode and an anode, and a permeable separator (not shown), which are collectively enclosed inside an electrically-insulated can or casing. Grouped battery cells may be connected in series or parallel through use of an electrical interconnect board and related buses, sensing hardware, and power electronics (not shown but well understood in the art). An application-specific number of the battery cells in battery pack 712 may be arranged relative to the battery tray 713 in columns and rows. In a nominal "xyz" Cartesian reference frame, for instance, the battery tray 713 when viewed from above or below may have a length (x-dimension) and a width (y-direction), with a height (z-dimension) extending in an orthogonal direction away from the battery tray 713.

In a representative use case, the electrified powertrain system 710 may be used as part of an EV 711 or another mobile system. As shown, the EV 711 may be embodied as a battery electric vehicle, with the present teachings also being extendable to plug-in hybrid electric vehicles. Alternatively, the electrified powertrain system 710 may be used as part of another mobile system such as but not limited to a rail vehicle, aircraft, marine vessel, robot, farm equipment, etc. Likewise, the electrified powertrain system 710 may be stationary, such as in the case of a powerplant, hoist, drive belt, or conveyor system. Therefore, the electrified powertrain system 710 in the representative vehicular embodiment of FIG. 7 is intended to be illustrative of the present teachings and not limiting thereof.

The EV 711 shown in FIG. 7 includes a vehicle body 722 and road wheels 724F and 724R, with "F" and "R" indicating the respective front and rear positions. The road wheels 724F and 724R rotate about respective axes 725 and 750, with the road wheels 724F, the road wheels 724R, or both being powered by output torque (arrow $T_O$) from a rotary electric machine ($M_E$) 726 of the electrified powertrain system 710 as indicated by arrow [24]. The road wheels 724F and 724R thus represent a mechanical load in this embodiment, with other possible mechanical loads being possible in different host systems. To that end, the electrified powertrain system 710 includes a power inverter module (PIM) 728 and the high-voltage battery pack 712, e.g., a multi-cell lithium-ion propulsion battery or a battery having another application-suitable chemistry, both of which are arranged on a high-voltage DC bus 727. As appreciated in the art, the PIM 728 includes a DC side (780) and an alternating current (AC) side 720, with the latter being connected to individual phase windings (not shown) of the rotary electric machine 726 when the rotary electric machine 726 is configured as a polyphase rotary electric machine in the form of a propulsion or traction motor as shown.

The battery pack 712 of FIG. 7 in turn is connected to the DC side 780 of the PIM 728, such that a battery voltage from the battery pack 712 is provided to the Power Integrated Module (PIM) 728 during propulsion modes of the EV 711. The PIM 728, or more precisely a set of semiconductor switches (not shown) residing therein, are controlled via pulse width modulation, pulse density modulation, or other suitable switching control techniques to invert a DC input voltage on the DC bus 727 into an AC output voltage suitable for energizing a high-voltage AC bus 720. High-speed switching of the resident semiconductor switches of the PIM 28 thus ultimately energizes the rotary electric machine 726 to thereby cause the rotary electric machine 726 to deliver the output torque (arrow $T_O$) as a motor drive torque to one or more of the road wheels 724F and/or 724R in the illustrated embodiment of FIG. 1, or to another coupled mechanical load in other implementations.

Electrical components of the electrified powertrain system 10 may also include an accessory power module (APM) 729 and an auxiliary battery ($B_{AUX}$) 730. The APM 29 is configured as a DC-DC converter that is connected to the DC bus 27, as appreciated in the art. In operation, the APM 729 is capable, via internal switching and voltage transformation, of reducing a voltage level on the DC bus 727 to a lower level suitable for charging the auxiliary battery 30 and/or supplying low-voltage power to one or more accessories (not shown) such as lights, displays, etc. Thus, "high-voltage" refers to voltage levels well in excess of typical 12-15V low/auxiliary voltage levels, with 400V or more being an exemplary high-voltage level in some embodiments of the battery pack 712.

In some configurations, the electrified powertrain system 710 of FIG. 7 may include an on-board charger (OBC) 32 that is selectively connectable to an offboard charging station 33 via an input/output (I/O) block 132 during a charging mode during which the battery pack 712 is recharged by an AC charging voltage ($V_{CH}$) from the offboard charging station 733. The I/O block 732 is connectable to a charging port 717 on the vehicle body 722. For instance, a charging cable 735 may be connected to the charging port 717, e.g., via an SAE J1772 connection. The electrified powertrain system 710 may also be configured to selectively receive a DC charging voltage in one or more embodiments as appreciated in the art, in which case the OBC 32 would be selectively bypassed using circuitry (not shown), e.g., that may be used to charge and/or discharge the battery pack 712 gradually for performing various functions, such as testing the SOC. The OBC 32 could also operate in different modes, including a charging mode during which the OBC 32 receives the AC charging voltage ($V_{CH}$) from the offboard charging station 733 to recharge the battery pack 712 after a low charge indicator light displays on the dashboard, and a discharging mode, represented by arrow $V_X$, during which the OBC 32 offloads power from the battery pack 12 to an external AC electrical load (L). In this manner, the OBC 32 may embody a bidirectional charger.

Still referring to FIG. 7, the electrified powertrain system 710 may also include an electronic control unit (ECU) 34. The ECU 734 is operable for regulating ongoing operation of the electrified powertrain system 10 via transmission of electronic control signals (arrow $CC_O$). The ECU 734 does so in response to electronic input signals (arrow $CC_I$). Such input signals (arrow $CC_I$) may be actively communicated or passively detected in different embodiments, such that the ECU 34 is operable for determining a particular mode of operation. In response, the ECU 34 controls operation of the electrified powertrain system 710. Thus, the ECU and its accompanying components may act as a BMS for performing functions including estimating the SOC, etc., To that end, the ECU 734 may be equipped with one or more processors (P), e.g., logic circuits, combinational logic circuit(s), Application Specific Integrated Circuit(s) (ASIC), electronic circuit(s), central processing unit(s), semiconductor IC devices, etc., as well as input/output (I/O) circuit(s), appropriate signal conditioning and buffer circuitry, and other components such as a high-speed clock to provide the described SOC functionality in prior figures, as well as different functions identified by the CC input signal. The ECU 734 also includes an associated computer-readable storage medium, i.e., memory (M) inclusive of read only, programmable read only, random access, a hard drive, etc., whether resident, remote or a combination of both. Control routines, including code for executing the SOC model with hysteresis, are executed by the processor to monitor relevant inputs from sensing devices and other networked control modules (not shown), and to execute control and diagnostic routines to govern operation of the electrified powertrain system 10. The I/O circuits may be directly coupled to the ECU 734, along with memory M and one or more processors P for executing code that estimates SOC. In an aspect, the BMS system may collectively be realized as ECU 734, OBC 32 and bus 727. OBC 32 and bus 27 may be an apparatus within the BMS, or included as part of the BMS that is enabled to be connected to the outer terminals of battery pack 712 to perform the functions recited herein. In some implementations, the BMS may be coupled directly with the battery pack.

Note that EV 711 may, like other vehicles, include a dashboard implanted within or otherwise connected to the body of EV 711. The body houses a cabin where the driver and any occupants reside. The apparatus discussed above may include control signals to the dashboard and conversion circuitry to enable the driver to assess the SOC remaining based on an amount or percentage of charge remaining, an estimated time that the vehicle will die or imminently needs recharging, and other data. At least some of these aspects may be computed by the BMS, including ECU 734 and its associated processor P running code from memory M. Messages may be sent via the I/O circuit to other parts of the vehicle, via $CC_0$ or another connection not specifically shown.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims. Moreover, this disclosure expressly includes combinations and sub-combinations of the elements and features presented above and below.

What is claimed is:

1. A battery management system (BMS) for one or more Lithium ion (Li+) battery cells, comprising:

an apparatus coupled with outer terminals of the one or more Li+ battery cells and configured to estimate an open circuit voltage ($V_{OC}$) across the Li+ battery cells, the apparatus further comprising:

a memory; and at least one processor coupled with the memory and configured, when executing code stored in the memory, to produce a state of charge (SOC) observer, the SOC observer including a hysteresis model to account for differential hysteresis in the one or more Li+ battery cells;

wherein the at least one processor is arranged to effect charging and discharging of the one or more Li+ battery cells to execute the hysteresis model;

wherein the hysteresis model dynamically models direction-dependent $V_{OC}$ behavior of the one or more Li+ battery cells based upon a direction of current flow and a state of charge; and wherein the SOC observer determines the SOC for the one or more Li+ battery cells based upon the $V_{OC}$ across the one or more Li+ battery cells.

2. The BMS of claim 1, wherein the SOC observer is configured to include in the hysteresis model a charge to discharge state and a discharge to charge state that when combined, results in continuous transitions of the open circuit voltage ($V_{OC}$) in both charge and discharge directions.

3. The BMS of claim 2, wherein the SOC observer is configured to use the charge to discharge state and the discharge to charge state to predict the $V_{OC}$.

4. The BMS of claim 1, wherein the SOC observer further includes:

an SOC model, the SOC model being further coupled with:

a resistance model for estimating voltage drop due to current;

an overpotential model for accounting for changes to a terminal voltage; and the hysteresis model.

5. The BMS of claim 1, wherein the at least one processor is configured, when executing the code to produce the hysteresis model, to determine static nonlinearity based on a direction of current flow.

6. The BMS of claim 1, wherein the at least one processor is configured, when executing the code to produce the hysteresis model, to determine an initial state of the hysteresis model from a charge to a discharge or a discharge to a charge when a change in a direction of a current is detected.

7. The BMS of claim 1, wherein the SOC observer comprises a Kalman filter.

8. An electric vehicle (EV), comprising:

a body, the body coupled to a dashboard, the body housing an internal vehicle cabin, the internal vehicle cabin having a plurality of controls and dials including an indicator identifying an amount of charge or a time period remaining for the EV to continue to run, the identified amount of charge or time period based on a state of charge (SOC) of lithium ion (Li+) battery cells powering the EV;

a powertrain system coupled with the body and coupled to at least four wheels; and a battery management system (BMS) for one or more of the Li+ battery cells, the BMS comprising:

an apparatus coupled with outer terminals of the one or more of the Li+ battery cells and configured to estimate a state of charge (SOC) of the Li+ battery cells, the apparatus further comprising:

a memory; and at least one processor coupled with the memory and configured, when executing code stored in the memory, to produce a state of charge (SOC) observer, the SOC observer including a hysteresis model to account for differential hysteresis in the one or more Li+ battery cells;

wherein the at least one processor is arranged to effect charging and discharging of the one or more Li+ battery cells to execute the hysteresis model;

wherein the hysteresis model dynamically models direction-dependent $V_{OC}$ behavior of the one or more Li+ battery cells based upon a direction of current flow and a state of charge; and wherein the SOC observer determines the SOC for the one or more Li+ battery cells based upon the $V_{OC}$ across the one or more Li+ battery cells.

9. The EV of claim 8, wherein the SOC observer is configured to include in the hysteresis model a charge to discharge state and a discharge to charge state that when combined, results in continuous transitions of open circuit voltage ($V_{OC}$) in both charge and discharge directions.

10. The EV of claim 9, wherein the SOC observer is configured to use the charge to discharge state and the discharge to charge state to predict $V_{OC}$.

11. The EV of claim 8, wherein the SOC observer further includes:

an SOC model, the SOC model being further coupled with:

a resistance model for estimating voltage drop due to a current;

an overpotential model for accounting for changes to a terminal voltage; and the hysteresis model.

12. The EV of claim 8, wherein the at least one processor is configured, when executing the code to produce the hysteresis model, to determine static nonlinearity based on a direction of current flow.

13. The EV of claim 8, wherein the at least one processor is configured, when executing the code to produce the hysteresis model, to determine an initial state of the hysteresis model from a charge to a discharge or a discharge to a charge when a change in a direction of the current is detected.

14. The EV of claim 8, wherein the SOC observer is a Kalman filter.

15. A method for determining the state of charge (SOC) of an electric vehicle (EV) powered by lithium ion (Li+) battery cells exhibiting hysteresis, comprising:

coupling a battery management system (BMS) with outer terminals of the Li+ battery cells;

executing code on at least one processor to determine an open circuit voltage ($V_{OC}$);

coupling the BMS with outer terminals of the Li+ battery cells; and executing code by at least one processor within the BMS to produce a state of charge (SOC) observer, the SOC observer including a hysteresis model to account for differential hysteresis in the Li+ battery cells;

wherein the at least one processor is arranged to effect charging and discharging of the one or more Li+ battery cells to execute the hysteresis model;

wherein the hysteresis model dynamically models direction-dependent $V_{OC}$ behavior of the one or more Li+ battery cells based upon a direction of current flow and a state of charge; and wherein the SOC observer determines the SOC for the one or more Li+ battery cells based upon the $V_{OC}$ across the one or more Li+ battery cells.

16. The method of claim 15, wherein the SOC observer includes in the hysteresis model a charge to discharge state and a discharge to charge state that when combined, results in continuous transitions of open circuit voltage ($V_{OC}$) in both charge and discharge directions.

17. The method of claim 16, wherein the SOC observer uses the charge to discharge state and the discharge to charge state to predict $V_{OC}$.

18. The method of claim 15, wherein the SOC observer further includes an SOC model, the SOC model being further coupled with:

a resistance model for estimating voltage drop due to current;

an overpotential model for accounting for changes to a terminal voltage; and the hysteresis model.

19. The method of claim 15, further comprising executing the code by the at least one processor to produce the hysteresis model to determine static nonlinearity based on a direction of current flow in the Li+ batteries.

20. The method of claim 15, further comprising executing the code by the at least one processor to produce the hysteresis model to determine an initial state of the hysteresis model from a charge to a discharge or a discharge to a charge when a change in a direction of the current is detected.

* * * * *